(12) United States Patent
Hipp

(10) Patent No.: US 6,359,492 B1
(45) Date of Patent: Mar. 19, 2002

(54) ARRANGEMENT FOR LEVEL CONVERSION OF HIGH-FREQUENCY LOW-VOLTAGE SIGNALS

(75) Inventor: Imre Hipp, Munich (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 09/688,554

(22) Filed: Oct. 16, 2000

(30) Foreign Application Priority Data

Oct. 15, 1999 (DE) .......................... 199 49 843

(51) Int. Cl.[7] ................................ H03L 5/00
(52) U.S. Cl. .................... 327/333; 327/551; 326/66
(58) Field of Search .............................. 326/62, 63, 64, 326/66, 68, 69, 73, 75, 77; 327/318, 319, 333, 551, 559

(56) References Cited

U.S. PATENT DOCUMENTS

| | | | | |
|---|---|---|---|---|
| 4,890,019 A | * | 12/1989 | Hoyte et al. | 307/475 |
| 4,906,871 A | * | 3/1990 | Iida | 307/475 |
| 5,450,024 A | * | 9/1995 | Ruegg | 326/66 |
| 5,751,184 A | * | 5/1998 | Shou et al. | 327/552 |
| 5,754,059 A | * | 5/1998 | Tanghet et al. | 326/77 |

* cited by examiner

*Primary Examiner*—Jeffrey Zweizig
(74) *Attorney, Agent, or Firm*—Schiff Hardin & Waite

(57) ABSTRACT

The transmission of high-frequency low-voltage signals between systems of different low-voltage technology fields is often desired. In the conversion from systems with low Vss parameters to systems with high Vss parameters, the invention uses a wired high-frequency transformer (T1), whereby the wiring contains passive components that allow the setting of the conversion parameters. A dc-related coupling of the transformer is also provided. In the reverse conversion, the invention includes an RC attenuation element (R4, C2) and a shunt resistor (R5) to the supply voltage. High immunity to noise and great adaptability are achieved in addition to space-savings and cost-elimination. The application to the clock supply of high bit rate switching network structures is especially advantageous.

9 Claims, 4 Drawing Sheets

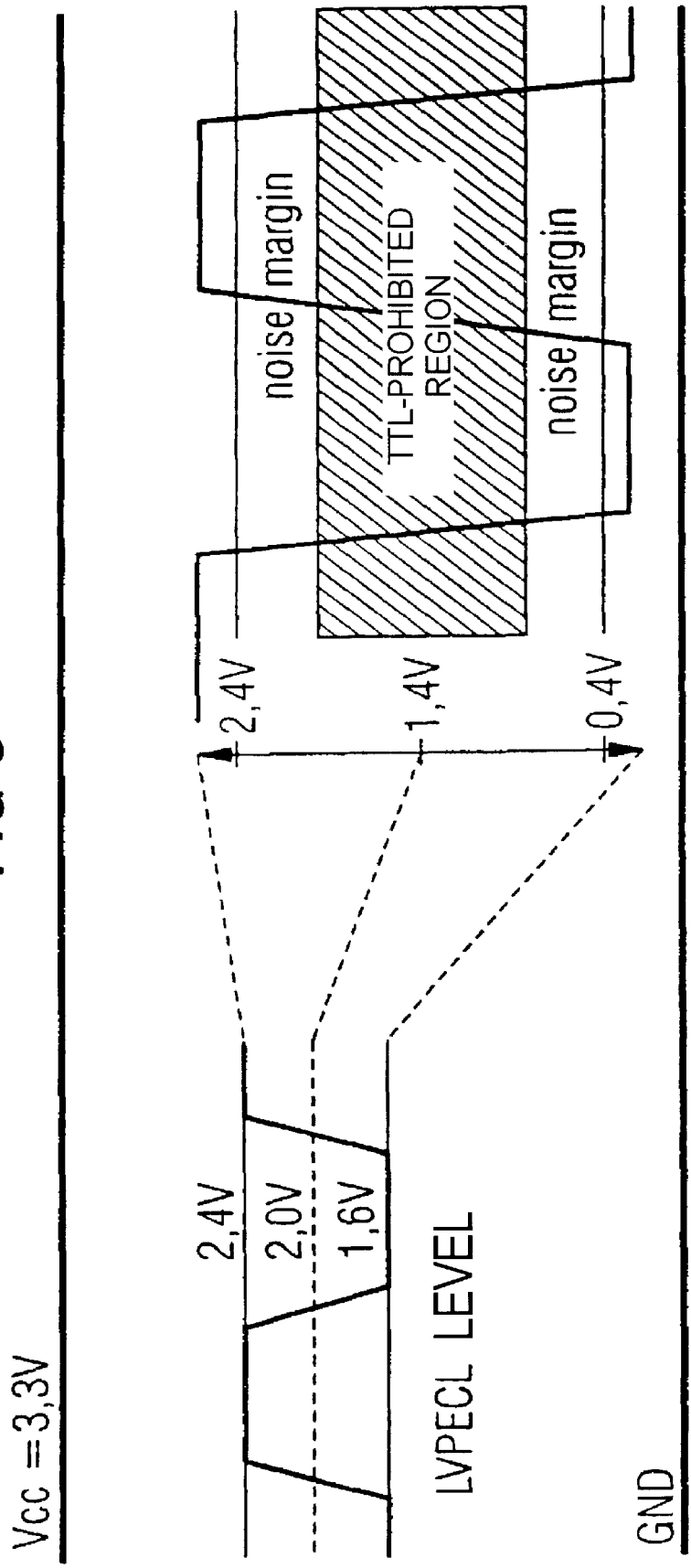

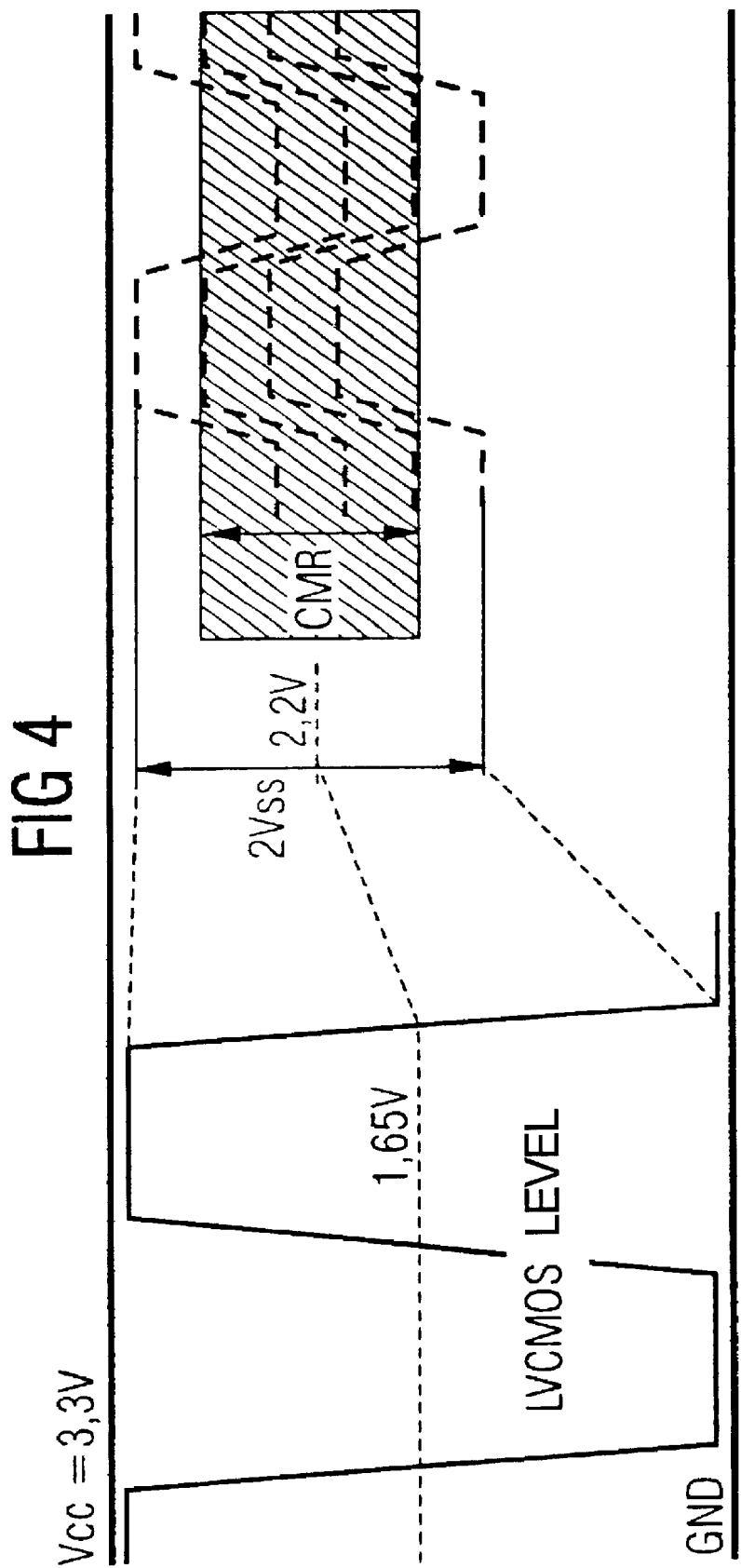

ARRANGEMENT FOR LEVEL CONVERSION OF HIGH-FREQUENCY LOW-VOLTAGE SIGNALS

BACKGROUND OF THE INVENTION

1. Field of the Invention

The invention is directed to an arrangement for level conversion of high-frequency low-voltage signals that are to be transmitted between systems of different low-voltage technology fields.

2. Description of the Related Art

The transmission of high-frequency low-voltage signals is increasing in significance, whether in the transmission of data signals or in the transmission of clock signals. The low-voltage signals are generated at the emitting side within the boundary conditions and parameters of a specific technology field. Attempts have always been made to employ the same technology at the receiver side in order to avoid losses and to particularly reduce attenuations.

Applications have been identified in which changing technology fields is advantageous. In such instances, however, it is necessary to adapt the high-frequency low-voltage signals to be transmitted that have been generated within the boundary conditions and parameters of one technology system to the boundary conditions and parameters of the other technology system. This is even required when the same supply voltage conditions are employed, for instance Vcc=3.3 V to ground potential.

A typical case of a level conversion is the transmission of clock signals from a low-voltage pseudo-ECL system to a low-voltage CMOS system and vice versa.

The problem underlying the invention is explained in greater detail on the basis of FIG. 2 and a specific application, namely the clock supply of high bit rate switching network structures in a narrowband switching system such as EWSD with a PLL system comprising a quartz oscillator, as explained, for example, in German Patent Application No. 199 43 172.8 filed Sep. 9, 1999.

FIG. 2 shows a function unit with which the switching network clock CLK2 at 2.048 KHz and an appertaining frame marking bit signal or, respectively, frame clock signal FMB2 at 8 KHz supplied from a preceding function unit (not shown) is converted into the required high-frequency clock signals. This function unit contains a middle, analog or, respectively, discrete part 21 with a 184 MHz sine oscillator in an LC structure in the form of a VCO 6. A low-voltage CMOS part 22 and a low-voltage pseudo-ECL part 23 are also provided, where the term "low-voltage" or "low-tension" is respectively indicated by the abbreviation LV.

At its input side, the low-voltage CMOS part 22 receives the clock signal CLK2 and the frame clock signal FMB2. At its output side, the low-voltage pseudo-ECL part 23 outputs a high-frequency clock signal CLK92, preferably at 92.16 MHz, and a frame marking clock signal or, respectively, frame clock signal FMB92, likewise at 8 KHz, that is decoupled from the frame clock signal FMB2 of the input side. The supplied clock signal CLK2 is supplied to a phase detector 8 (PD) in the low-voltage CMOS part 22, the phase detector being constructed in the form of an exclusive-OR element.

The output signal of the low-voltage CMOS part 22 enters via a low-pass filter 9 (loop filter) with a limit frequency of 200 KHz into a VCO 6 that is discretely constructed. The output signal of the VCO 6 at 184 MHz is an input signal of a comparator 73 of a converter 7 in the low-voltage pseudo-ECL part 23. The comparator 73 compares to an internal reference signal 74 and outputs its output signal to two dividers 71 and 72. Here, the divider 71 is a 1:2 divider that outputs a signal with the frequency 92.16 MHz at its output side as clock signal CLK92. The other divider 72 is a 1:6 divider that feeds back an output signal at 30.72 MHz as feedback signal via a feedback loop 13. In the analog part 21, the feedback loop 13 contains a level converter 14 for the conversion from the low-voltage pseudo-ECL level onto the low-voltage CMOS level and further contains a step-down device 15 in the low-voltage CMOS part 22 that is fashioned as a 1:15 divider in order to again obtain a signal with the frequency 2.048 KHz. This signal is resupplied to the phase detector 8 as a feedback signal.

The low-voltage CMOS divider 22 also contains a synchronizer 18 that receives the frame clock signal at 8 KHz at its input side and that is synchronized by the fedback signal divided down by the step-down device 15. The output signal of the synchronizer 18, which is already decoupled in phase position here from the phase of the frame clock signal FMB2 of the input side, is supplied to a phase element 16 in the low-voltage pseudo-ECL part 23 via a level converter 17 in the analog part 21 for conversion from the low-voltage CMOS level onto the low-voltage pseudo-ECL level, the phase element 16—for phase drive—receiving the output signal of the divider 72 or of an identical divider as well as the output signal of the divider 71, i.e., the high-frequency clock signal CLK92, and, using these signals and two ultra-fast flip-flops in the phase element 16, adapting the phase position of the output frame clock signal FMB92 with 8 KHz to the output clock signal CLK92, first roughly and then finely.

What the division of the components onto the CMOS part 22 and the pseudo-ECL part 23 effects is that time-critical functions are realized in the low-voltage pseudo-ECL part 23 and gate-intensive functions are realized in the low-voltage CMOS part 22. The functions in the low-voltage CMOS part 22 are thereby expediently realized with standardized, electrically programmable logic fields (FPGA), whereas the functions in the low-voltage pseudo-ECL part 23 are realized with the assistance of ultra-fast, discrete components. The connection of the interfaces of said two parts 22 and 23 occurs in the middle part 21 via exclusively analog or, respectively, passive components, as a result of which the immunity of the overall system to noise influences is enhanced. The required power supply of the individual parts 21, 22 and 23 is expediently island-like/isolated, i.e., respectively separately implemented, in order to suppress noise infeeds among one another and from clock-alien regions of the various parts. Expediently, the level converters 14 and 17 should prevent a source for jitter or for noise emissions from arising.

The initially cited problems arise in the implementation of such an arrangement. This is especially true when each of the parts 22 and 23 is optimally designed in view of the payload signals to be processed, particularly when using commercially available components.

The module MC100LVEL38 of Motorola, a "low skew clock generation chip", was proposed in the low-voltage pseudo-ECL part 23 in one implementation. This module is optimally suited for the conversion of high-frequency sine signals (from the VCO 6) into the required logic level in the low-voltage pseudo-ECL part 22. As a result of an internal 1:6 frequency divider, use in high-frequency PLL applications to far above 100 MHZ is especially beneficial since a feedback signal can be output to the low-voltage CMOS part 22, namely its step-down device 15, without intermediate amplifiers or dividers. This can be realized by standardized, electrically programmable logic fields FPGA that have a relatively high input capacitance of 15 through 20 pF. The phase element 16 can in turn be implemented with the module MC100LVEL51 of Motorola, an "ultra high speed differential clock D-flip flop". As a result of its negligible gray switching area (clock/data-timing ts+th≦100 ps), this module is optimally suited for the sampling function in the phase-in in the low-voltage pseudo-ECL region 23 of the high-frequency signal.

The following technology families have been taken into consideration in the low-voltage CMOS part 22 in the realization:

| ASIC | | FPGA |
|---|---|---|
| Texas Instruments TGC 4000 Technology: "sea of gates" I/O types | XILINX FC 4000 LVCMOS I/O types | ALTEPA FLEX 6000 CMOS I/O types |
| LVTTL_I PBCL_I LVDS_O LVCMOS_O | LVTTL_I LVCMOS_I LVCMOS_O | TTL_I CMOS_I CMOS_O |

Specific high-speed connections can be realized in the TGC family with the I/O cell pair LVDS_O and PECL_I that work with a quasi low-voltage pseudo-level matched to one another.

In the XC 4000 family, specific LVCMOS_I input cells that are distinguished by their higher sensitivity for HF applications are available in addition to the standard TTL or, respectively, LVTTL cells. Only the standard TTL input type comes into consideration for HF PLL applications in the FLEX 6000 family.

Very different parameters derive in such an implementation, even when the same supply voltage system is employed, although constructed island-like as mentioned above. The threshold relationships are of significance in the present case.

A brief overview of the threshold relationships of the various input types is presented in the following table.

| Type | TTL/LVTTL | LVMOS | CMOS[1] |
|---|---|---|---|
| $V_1(H)min$ | 2.0 V | 0.5* VCC | 0.7* VCC |
| $V_1(L)max$ | 0.8 V | 0.3* VCC | 0.2* VCC |
| $dV_1min$ [2] | 1.2 V | 0.7 V | 2.5 V |
| $V_1(ss)min$ [3] | 2.0 Vss | 1.5 Vss | 3.3 Vss |

[1] Thresholds at Vcc = 5 V
[2] Threshold spacing without "noise margin" at Vcc = 3.3 V
[3] Minimum level with a standard 2*0.4 V "noise margin"

An output voltage that is higher than 2.0 Vss is desired for a universal usability in the level conversion thus deriving from the low-voltage pseudo-ECL domain (at the left in FIG. 3) into the low-voltage CMOS domain (at the right in FIG. 3).

FIG. 3 thus shows a level diagram of the conditions that must be adhered to for the level conversion from the low-voltage pseudo-ECL domain to the low-voltage CMOS domain.

The low-voltage pseudo-ECL level of 0.8 through 0.9 Vss should therefore be amplified by about a factor 3 (corresponding to 10 dB) to a level range from 2.4 to 2.7 Vss, whereas the dc voltage level should be lowered from approximately 2.0 V to 1.4 V, the nominal TTL threshold. The desired attenuation of the dc voltage level therefore amounts to approximately −3.3 dB (a=0.68), where the level itself should not be co-attenuated. Since the low-voltage level in the low-voltage pseudo-ECL domain is linked to the supply voltage (Vcc=3.3V), the stability and the filtering of the supply voltage are very important for use in low-jitter PLL circuits.

The different parameter conditions in the opposite direction, i.e., from the low-voltage CMOS domain (at the left in FIG. 4) to the low-voltage pseudo-ECL domain (at the right in FIG. 4) are shown in greater detail in FIG. 4. This involves the most optimum adaptation of the various levels by an attenuation and level shifting. These givens must be taken into consideration due to the presence of high-frequency signals. In particular, the dependability of the phase-in can be improved when the edge steepness can be increased.

SUMMARY OF THE INVENTION

It is thus an object of the present invention to specify arrangements for level conversion that allow a simple yet broadband realization. This object is achieved by an arrangement for level conversion of high-frequency low-voltage signals that are transmitted between systems of a first low-voltage technology field circuit and a second low-voltage technology field circuit, comprising:

a high-frequency transformer comprising a primary and secondary winding;

a converter circuit comprising a first side and a second side;

the primary winding of the transformer being connected to an output signal of a drive stage at an output side of the first technology field circuit;

the secondary winding of the transformer being connected to the converter circuit on the first side of the converter circuit, the converter circuit being connected via an output signal of the converter circuit to a high input-side load capacitor of the second technology field circuit on the second side of the converter circuit;

the converter circuit comprising:

a dc coupling of the transformer; and a series resistor and a parallel resistor for setting a dc level of the output signal of the converter circuit.

The converter circuit may further comprise a coupling capacitor connected in parallel to the series resistor, and may further comprise a further series resistor for an emitter current supply of an output transistor of a driver stage of the first technology field circuit.

The object is also achieved by arrangement for level conversion of high-frequency low-voltage signals that are transmitted between systems of a first low-voltage technology field circuit and a second low-voltage technology field circuit, comprising an RC attenuation element tuned in high-frequency fashion between: a) an output of an output driver of the second low-voltage technology field circuit, and b) a load capacitor as well as a load resistor of an input transistor circuit of an input transistor of the first low-voltage technology field circuit.

The RC attenuation element may also comprise a series resistor and a shunt resistor for setting a dc level as well as an overall current.

The first low-voltage technology field circuit may be formed by pseudo-ECL technology and the second low-voltage technology field circuit may be formed by CMOS technology.

The invention can be particularly employed in an arrangement for clock supply of high bit rate switching network structures.

BRIEF DESCRIPTION OF THE DRAWINGS

The invention is explained in greater detail on the basis of exemplary embodiments shown in the drawings.

FIG. 3 is a chart showing voltage levels and explaining the basic parameters for the level conversion of a first type; and FIG. 4 is a chart showing voltage levels and explaining the basic parameters for the level conversion of a second type.

DESCRIPTION OF THE PREFERRED EMBODIMENTS

Figure 2:
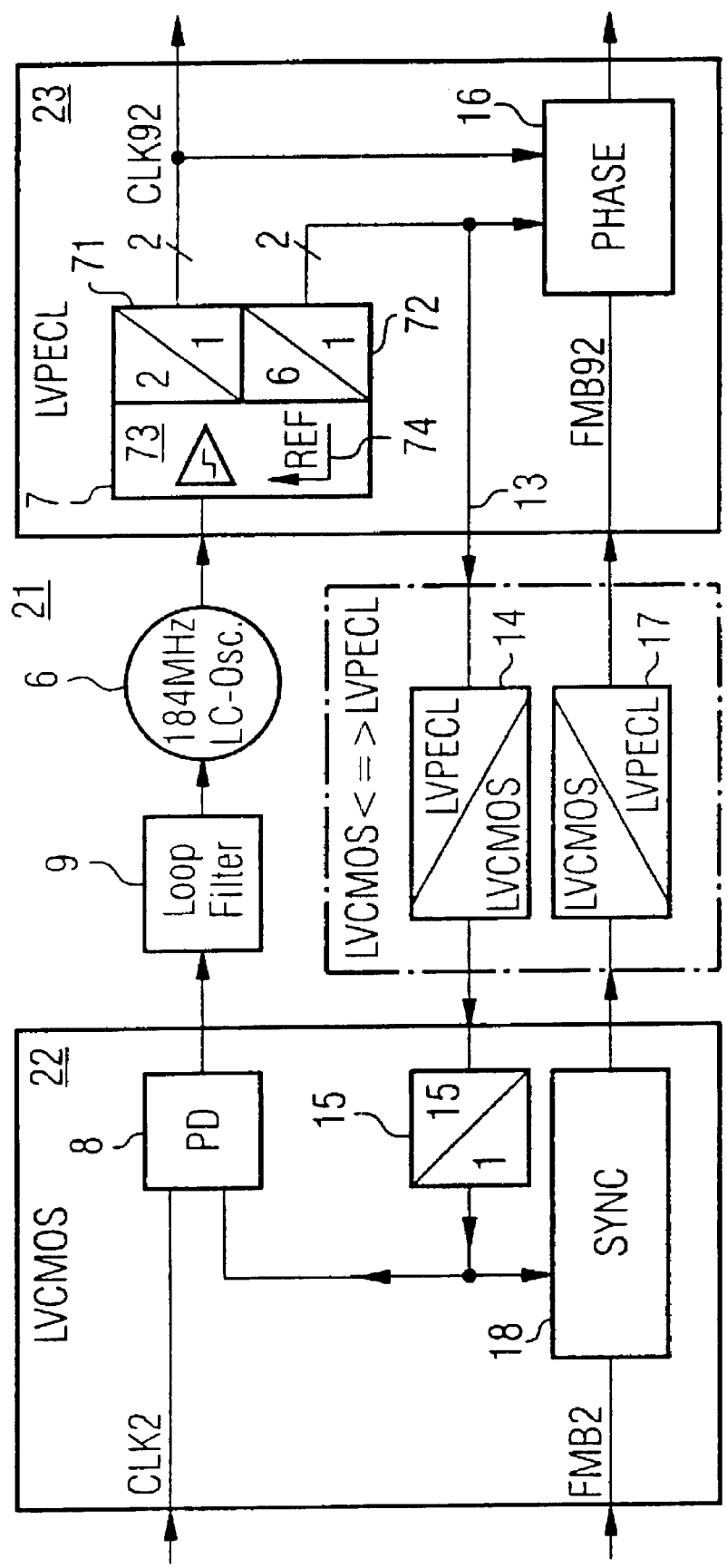
FIG. 2 is a block diagram illustrating a preferred application of the level converters explained in FIG. 1.

The application according to FIG. 2 and the associated basic problems have been explained above. The basic parameters have likewise been explained above on the basis of FIG. 3 and FIG. 4; these parameters must be taken into consideration in the transitions from one technology area to another technology area. The numerical values recited in these figures and below are self-evident and are recited only by way of example.

It is obviously critical for the level conversion according to FIG. 3 that the signals supplied to the level converter at the input side have a significantly lower spacing of the peak-to-peak signal levels compared to the signals output at the output side and also have a different DC voltage level. It is also clear that, according to FIG. 4, conditions that are exactly the opposite are present in the conversion in the other direction.

Figure 1:
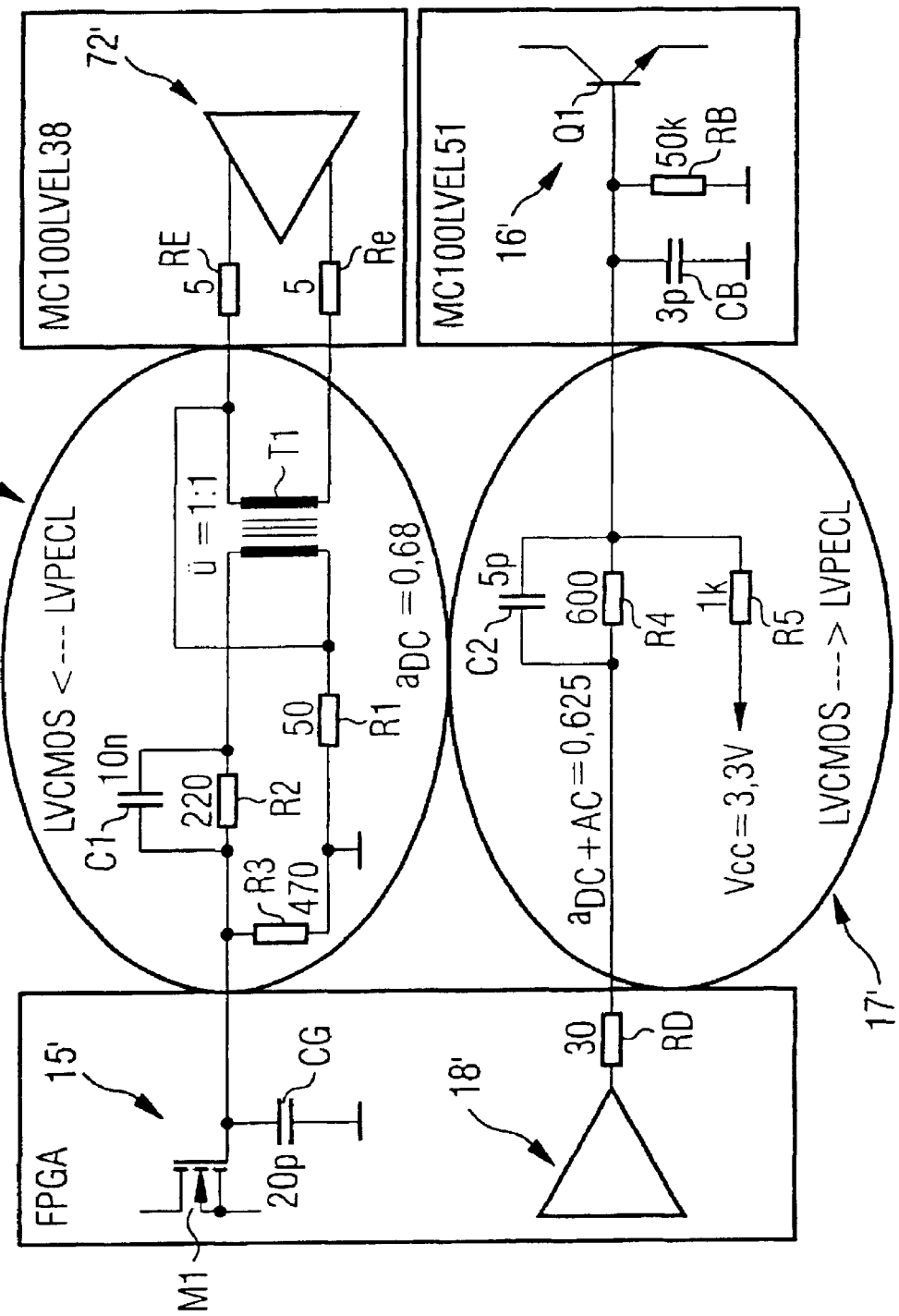
FIG. 1 is a schematic diagram showing the structure of two level converters for the conversion in the sense of FIG. 3 on the one hand and of FIG. 4 on the other hand.

FIG. 1 shows specific implementations with analog, passive components of the level converters and the demands according to FIGS. 3 or 4. Accordingly, the former level converter is referenced 14' in FIG. 1, whereas the latter level converter is referenced 17' in FIG. 1. Based on FIG. 2, the respective components that provide the input signals to the level converter or, respectively, receive the output signals from the level converter are also provided with corresponding reference characters that are provided with a prime.

The indicated numerical values for the design of the individual components refer to the specific implementations of the corresponding components in parts 22 and 23 explained above (FIG. 2).

In FIG. 1, the critical component for the level converter 14' is a high-frequency transformer T1. This transformer T1 is generally more cost-beneficial than a level converter chip for the required frequency range (30.72 MHz in the exemplary embodiment). The SMD-HF transformers from the E6.3 series of Siemens Aktiengesellschaft (Article No. V42229-F339-A) prove especially suitable. This transformer has very good high-frequency properties because it contains 2×3 windings (0.16Cu2L) wound tightly in parallel on a T38 ferrite core (ALnom=1.700) that is free of an air gap.

The primary winding of the transformer T1 lies at the output-side driver of the step-down device 72', as schematically shown. The secondary winding is, on the one hand, applied to ground via a resistor R1 and, on the other hand, comprises the output line that leads to the input transistor M1 and to the input capacitance CG of the step-down device 15'. The input capacitance CG lies between the signal line and ground. Furthermore, primary and secondary voltage are cascaded. Finally, the transformation factor of the combiner of the transformer T1 is optimized to a value of $\ddot{u}=1:1$.

The secondary side is wired in the following way: the other side of the secondary winding is conducted toward the outside via a parallel circuit of a resistor R2 and a capacitor C1. A resistor R3 lies between ground and the signal line of the output side. As stated, a series circuit of the secondary winding and the resistor R1 is provided between said output-side and of the secondary winding and ground.

Due to the addition of the push-pull voltage of the output driver of the step-down device 72' to the secondary voltage, a gain of approximately 10 to 11 dB is achieved. If the actual wiring were loss-free, a gain of 12 dB could even be achieved. By providing the resistor R1, a supply of the output transistors of the driver with emitter current is achieved. The secondary-side load capacitor CG in the step-down device 15' influences the edge steepness. The dynamic generator resistor Re of the driver, however, is extremely low-impedance, resulting in the limitation of the edge steepness being only slight.

The DC voltage value can be adapted in that R2 and R3 are selected in a suitable way after the DC-related coupling of the transformer T1 has been achieved. The coupling capacitor C1 bridging the resistor R2 is provided in order to prevent the high-frequency signal of the output side from being divided.

The level conversion from the low-voltage pseudo-ECL domain to the low-voltage CMOS domain according to an exemplary embodiment of the invention is thus realized with a high-frequency transformer on the basis of specific wiring, taking a power output pair of an output-side driver stage in the low-voltage pseudo-ECL domain into consideration. The cascading of primary and secondary voltage, despite the desired, optimum translation of the high-frequency transformer corresponding to $\ddot{u}=1:1$, achieves a signal gain that reaches 10 dB, i.e., that is greater than the factor 3.

In the level conversion in the other direction in the sense of FIG. 4, the converter 17' is implemented by an RC attenuation element specifically matched to high-frequency signals that is formed by a resistor R4 and a capacitor C2 parallel to it, by which the setting of the DC voltage level is achieved via a further resistor R5 that is connected to the supply voltage Vcc. This results in permitting adaptation of the high-frequency signal attenuation and the DC voltage level to the desired range of the interface to the low-voltage pseudo-ECL domain. The level is expediently set to the maximally allowed value in order to enhance the dependability of the phase-in (in the phase element 16') by increasing the edge steepness. The "common mode range" particulars (CMR) of the components employed for the implementation of the phase element 16' can thereby be utilized. As a result of a corresponding selection of the values of the components R4, R5 and C2 of the level converter 17', the output levels for the RC attenuation element can be fixed at 2Vss with the DC level of 2.2V. It thus follows that, with an input level of 3.2Vss having a DC voltage level of 1.65V (FIG. 4), an optimum attenuation factor derives at a=0.625 (corresponding to -4 dB) when the attenuation element is connected to the supply voltage Vcc via the resistor R5.

The DC voltage level and the Vss range can therefore be set at one time with little outlay for components.

Overall, a very broadband level conversion or, respectively, level matching can be inventively achieved in both directions in this way in order: 1) to achieve a defined switching of the input cells in the low-voltage CMOS part 22 for optimum jitter dosing of the phase-locked loop PLL (FIG. 2) or, 2) in order to be able to always assure the unambiguous nature of the phase-in of the frame clock FMB 92 to the high-frequency system clock CLK 92 in the low-voltage pseudo-ECL domain.

It is also particularly advantageous given this latter level conversion from the low-voltage CMOS domain to the low-voltage pseudo-ECL domain (level converter 17'), to select the output-side driver of the synchronizer 18' such that it is suitable for a range from 8 through 12 mA. As a result of this, the low-pass effect of the attenuation element of the level converter 17', which is relatively high-impedance, can be compensated. This is due to the fact that an optimum high-frequency matching is only theoretically possible, namely for RD=0. The real output impedance of the driver, however, is finite. Using an output driver of the 12 mA type in the direction to ground (GND), what is still a very good edge steepness>1V/ns (given 2Vss) can still be achieved (also see FIG. 4).

Finally, a low-overall current is also significant. This is defined by the sum of the resistors R4 and R5 and, given a suitable definition within the selected numerical ranges, can be fixed at 2 mAos. As a result of such a low load, the dependency of the output level existing in practice on the influences of the supply voltage Vcc that is present in practice and the temperature influences can be kept slight, particularly when the input impedance RB of the phase element 16' is very high-impedance, by a factor of 100. This is in fact a compromise, but nonetheless assures that the load capacitance CB can be relatively well-compensated by the attenuation capacitor C2.

The load capacitances, CG on the one hand and CG on the other hand, also contain parasitic components and influences such as layout, housing, silicon and the like.

The simple structure achieved by passive components, permits low space-requirements and cost outlay, and this arrangement is extremely immune to disturbance. i.e., the signals to be processed are influenced extremely little in quality, which is very important for especially high-frequency signals, as required in the invention.

The employment of both inventive converters as explained in the exemplary embodiment according to FIG. 1 is not a compulsory feature; however, it is advantageous when double conversions in both directions are required in the overall application. As initially mentioned, the indicated numerical values are by way of example. The fundamentals of the present invention can also be applied to other parameter values and supply voltage values.

The above-described converters are illustrative of the principles of the present invention. Numerous modifications and adaptations thereof will be readily apparent to those skilled in this art without departing from the spirit and scope of the present invention.

What is claimed is:

1. An arrangement for level conversion of high-frequency low-voltage signals that are transmitted between systems of a first low-voltage technology field circuit and a second low-voltage technology field circuit, comprising:
   a high-frequency transformer comprising a primary and secondary winding;
   a converter circuit comprising a first side and a second side;
   said primary winding of said transformer being connected to an output signal of a drive stage at an output side of said first technology field circuit;
   said secondary winding of said transformer being connected to said converter circuit on said first side of said converter circuit,
   said converter circuit being connected via an output signal of said converter circuit to a high input-side load capacitor of said second technology field circuit on said second side of said converter circuit;
   said converter circuit comprising:
      a dc coupling of said transformer; and
      a series resistor and a parallel resistor for setting a dc level of said output signal of said converter circuit.

2. An arrangement according to claim 1, wherein said converter circuit further comprises a coupling capacitor connected in parallel to said series resistor.

3. An arrangement according to claim 1, wherein said converter circuit further comprises a further series resistor for an emitter current supply of an output transistor of a driver stage of said first technology field circuit.

4. An arrangement according to claim 1, wherein said first low-voltage technology field circuit is formed by pseudo-ECL technology and said second low-voltage technology field circuit is formed by CMOS technology.

5. A method for using the an arrangement according to claim 1, comprising the step of:
   applying said arrangement as a clock supply of high bit rate switching network structures wherein high-frequency low-voltage signals are clock signals.

6. An arrangement for level conversion of high-frequency low-voltage signals that are transmitted between systems of a first low-voltage technology field circuit and a second low-voltage technology field circuit, comprising:
   an RC attenuation element tuned in high-frequency fashion between: a) an output of an output driver of said second low-voltage technology field circuit, and b) a load capacitor as well as a load resistor of an input transistor circuit of an input transistor of said first low-voltage technology field circuit.

7. An arrangement according to claim 6, wherein said RC attenuation element comprises a series resistor and a shunt resistor for setting a dc level as well as an overall current.

8. An arrangement according to claim 6, wherein said first low-voltage technology field circuit is formed by pseudo-ECL technology and said second low-voltage technology field circuit is formed by CMOS technology.

9. A method for using the an arrangement according to claim 6, comprising the step of:
   applying said arrangement as a clock supply of high bit rate switching network structures wherein high-frequency low-voltage signals are clock signals.

* * * * *